RADIATION RESISTANT SOLAR CELL

Original Filed March 23, 1964

8 Sheets-Sheet 1

STEPHEN KAYE,
LOUIS GARASI,
GEZA P. ROLIK,
INVENTORS.
By THEIR ATTORNEYS.
Spensley & Horn STEPHEN KAYE,
LOUIS GARASI,
GEZA P. ROLIK,
INVENTORS.
BY THEIR ATTORNEYS.
Spensley & Horn.

United States Patent Office 3,513,040

Patented May 19, 1970

3,513,040
RADIATION RESISTANT SOLAR CELL

Stephen Kaye, Pasadena, Louis Garasi, Los Angeles, and Geza P. Rolik, La Canada, Calif., assignors, by mesne assignments, to Xerox Corporation, a corporation of New York Original application Mar. 23, 1964, Ser. No. 354,077, Divided and this application Apr. 12, 1967, Ser. No. 644,425
Int. Cl. H01l 7/46
U.S. Cl. 148—178 3 Claims

ABSTRACT OF THE DISCLOSURE

Method for fabricating radiation resistant solar cell by alloying a graded base region to a low resistivity substrate of semiconductor material of the same conductivity type, the graded base region being substantially thinner than the substrate and increasing in resistivity away from the substrate, and providing a thin region of the opposite conductivity type atop the graded base reigon.

CROSS-REFERENCES TO RELATED APPLICATIONS

This is a division of application Ser. No. 354,077, filed Mar. 23, 1964, now abandoned.

BACKGROUND OF THE INVENTION

Solar cells presently used for the conversion of radiation energy to electrical energy as a power source for instruments in space vehicles typically suffer from reduced conversion efficiency upon exposure to high intensity radiation. These cells are generally constructed of semiconductor material including a PN junction. The junction may be produced for example, by introduction of an N-type impurity into a P-type conductivity starting crystal, resulting in an intermediate junction reigon. The undiffused portion of the parent crystal, termed the base region, has a substantially uniform impurity concentration in the base region. Photo-generated carriers are collected by diffusion to the junction.

These present art solar cells require relatively high base region minority carrier lifetime (of the order of 10 microseconds) to permit a high efficiency solar cell. Such cells are sensitive to nuclear radiation which tends to reduce this lifetime. Recent attempts are being made to modify the parameters of the semiconductor materials to provide radiation resistance and thus retain high lifetime in the presence of nuclear radiation. However, these have not heretofore resulted in significant solar cell radiation damage resistance.

SUMMARY OF THE INVENTION

The present invention resides principally in the discovery that solar cells can be fabricated which possess such radiation resistance by providing a novel graded resistivity material profile in the solar cell semiconductor crystal.

More particularly, in accordance with the presently preferred embodiment of this invention, there is provided a solar cell having a substrate portion of a predetermined conductivity type of relatively low resistivity and of a predetermined thickness. Contiguous with this substrate portion is a graded base region whose conductivity decreases in the direction away from the substrate. This graded base region is of the same conductivity type as the substrate but has a thickness which is considerably less. A still thinner region of opposite conductivity to provide a PN junction is disposed contiguous with the graded base region at the surface opposite the substrate. The substrate region and the graded base region are formed by beginning with two separate crystals of a predetermined resistivity which are joined together by alloying with aluminum.

It is therefore an object of the present invention to provide an improved solar cell which is resistant to radiation damage.

A further object of the present invention is to provide a novel method for the construction of a radiation resistant solar cell.

Another object of the present invention is to provide a solar cell of improved design having a substantially greater resistance to radiation damage for a given efficiency level than has heretofore been obtainable.

Another object of the present invention is to provide a solar cell of the character described which operates with relatively high energy conversion efficiency for a substantial period of time in the lower regions of the Van Allen radiation belt.

The novel features which are believed to be characteristic of the invention, both as to its organization and method of operation, together with further objects and advantages thereof will be better understood from the following description considered in connection with the accompanying drawings in which several presently preferred embodiments of the invention are illustrated by way of example. It is to be expressly understood, however, that the drawings are for the purpose of illustration and description only and are not intended as a definition of the limits of the invention.

DESCRIPTION OF THE PREFERRED EMBODIMENT

Figure 1:
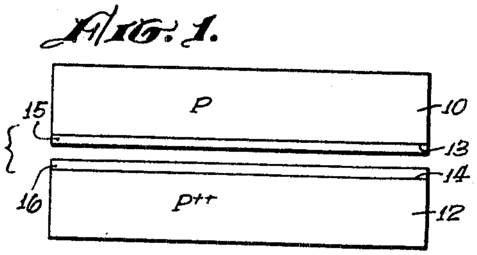
FIG. 1 is a sectional schematic illustration of two silicon bodies at an early stage in the fabrication of the presently preferred embodiment of a solar cell in accordance with this invention.
Figure 2:
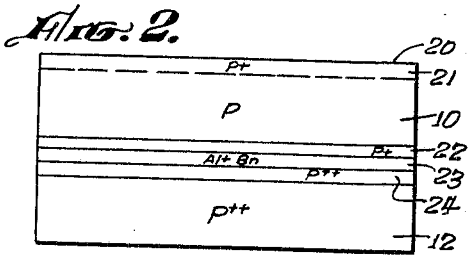
FIG. 2 is a sectional illustration of the parts of FIG. 1 at a later stage of production.

Reference is now made to the drawings and particularly to FIG. 1 wherein there is shown two silicon bodies 10 and 12 each of which are approximately 15 mils thick and assume a generally rectangular shape of 1 x 2 cm. Silicon body 10 is of a high resistivity, i.e., of the order of 25 ohm cm. while body 12 is of a low resistivity silicon, i.e., of the order of 0.0001 ohm cm. In the presently preferred embodiment both of these bodies are of P-type conductivity, they being boron doped during the crystal growing process in a manner well known to the art. Accordingly, body 10 is labeled as being of P-type conductivity while body 12 is labeled as P++, the pluses indicating that the conductivity is substantially higher than what is normally required to render a body of silicon of P-type conductivity. In manufacture both of these bodies are typically etch polished after which there is deposited on the surfaces 13 and 14 thereof a thin layer of aluminum, i.e., of the order of ½ micron. The layers of aluminum are labeled as 15 and 16, respectively. The two bodies 10 and 12 are now placed in a furnace with the aluminum layers 15 and 16 being brought into mating contact. The bodies are maintained within the furnace at a temperature of approximately 1200° C. for around 20 hours. Following this step the two bodies 10 and 12 will be fused together and intermediate layers will be formed as is shown in FIG. 2 thus forming one composite silicon body. Viewing the composite body from the upper surface 20 downwardly the diffused region is labeled 21 and is of P+ conductivity to a depth of approximately 2.0 mils. This conversion of the upper surface 20 occurs because of out-diffusion of boron from the bodies 10 and 12 during the fusion heating process above described. The second layer is the original body 10 and is shown to be of P-type conductivity. Below section 10 is a section labeled 22 which is of P+ conductivity and is also of the thickness of approximately 2.0 mils. It is formed by a conversion or out diffusion of boron from bodies or sections 10 and 12 as well as alloying and diffusion of the aluminum layers 15 and 16 (shown in FIG. 1) which become molten at the furnace temperature of 1200° C. Below layer 22 is layer 23 which is a combination of aluminum and boron, the boron resulting from out-diffusion of both regions 10 and 12 while the aluminum is that remaining from the composite of the joined layers 15 and 16. Below layer 23 layer 24 is formed, indicated as being P++. It, like layer 22 is formed in a similar manner and to a comparable depth. It is indicated as being more heavily doped or of a higher impurity concentration than is layer 22 because it is formed within body or section 12 which was initially of a higher P-type concentration. Finally, there is shown initial layer 12 as being of P++ conductivity.

As an alternative, boron may also be deposited along with, prior to, or subsequent to the aluminum layer rather than depending primarily upon out-diffusion from layers 10 and 12 to determine the amount of boron available for diffusion into the graded base region. It should be pointed out that the diffusion of boron and aluminum both occur and this, together with the alloying and regradient of aluminum with the adjoining silicon in layer 10 determines its concentration gradient. The boron, however, is the primary and only necessary source of active impurity for this purpose. The primary purpose for the aluminum is to alloy, or fuse together, layers 10 and 12.

Figure 3:
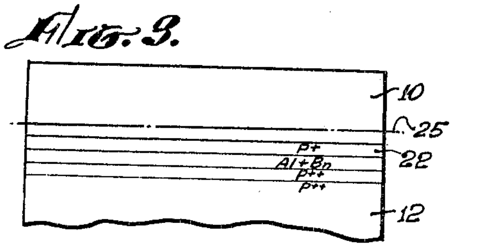
FIG. 3 is an illustration of the cell at still another stage of completion.

In FIG. 3 there is shown a cut line 25. This line indicates the portion of the body of FIG. 2 which is to be removed by lapping. There will typically be of the order of 10 to 12 mils of material removed. The amount of material to be removed by lapping is determined by the desire to remove the entire P+ layer 21 and almost all of the initial P layer 10, i.e., to approximately 0.2 of a mil of the top of the out-diffused P+ layer 22.

Figure 4:
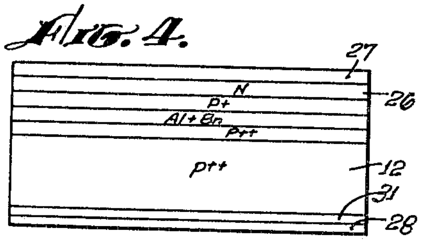
FIG. 4 is a sectional illustration of the nearly completed solar cell in accordance with the presently preferred embodiment of this invention.

The next step in the formation of the present invention device is to provide a PN junction, preferably by the diffusion of $P_2O_5$ into the upper surface of the remaining portion of section 10 to produce an N type conductivity diffused region therein. This is accomplished by exposing the body to a source of $P_2O_5$ in a furnace at a temperature of approximately 930° C. for about ½ hour to thus result in an N type diffused region as shown in FIG. 4, labeled as 26. This region will be approximately ½ micron deep. During the formation of this N type region there will be formed a layer of phosphate glass at the upper and lower surface of the body, these layers being indicated by the numerals 27 and 28 in FIG. 4. In addition, a layer 31 of N type conductivity will be formed in the lower surface of the P++ region 12. Both layers 31 and 28 are next removed by a lapping process after which the phosphate glass layer 27 is removed from the upper surface of layer 26 by exposing this surface to a hydrofluoric acid etch.

The diffused or radiation receiving region may alternately be formed by epitaxial growth rather than by diffusion, in a manner well known to the art.

The radiation receiving surface which is the upper surface of layer 26 will next have deposited thereupon a conductive grid which may assume any desired pattern and which is provided in any conventional manner.

Figures 5, 6:
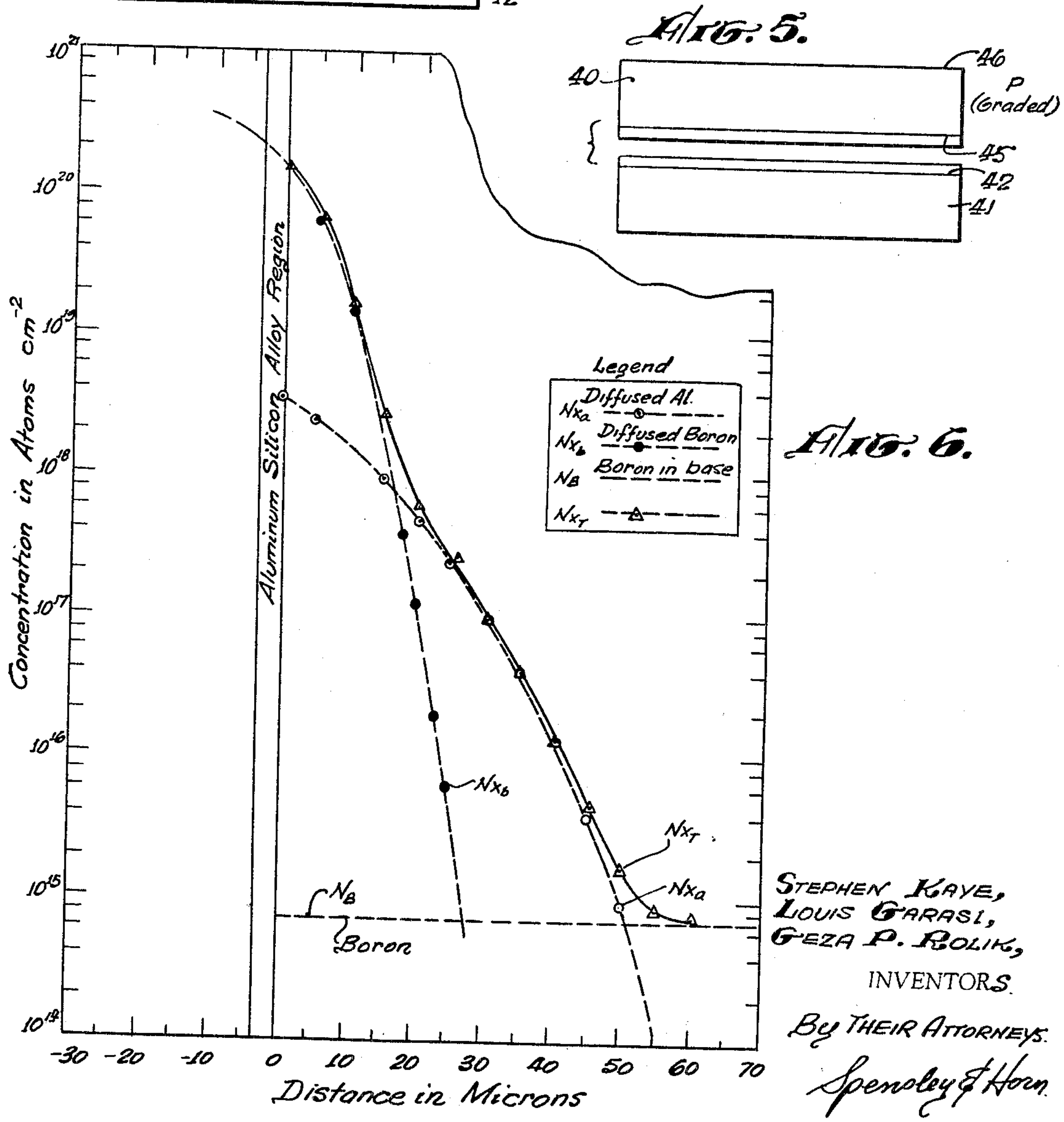
FIG. 5 is a sectional view similar to FIG. 1 showing two silicon bodies at an early stage in the fabrication of an alternate embodiment of a solar cell to be constructed in accordance with this invention.
FIG. 6 is a graph showing aluminum-boron concentration within the cell made by the alloy-diffusion process.

A graph of the diffusion profile of aluminum-boron into layer 10 is shown in FIG. 6. This shows the penetration into the P-type layers of impurities from the aluminum-silicon alloy region to follow the equation $$N_{x_a}+N_{x_b}+N_B=N_{xT}$$

where $$N_x=\frac{N_o}{2}\left[erfc\left(\frac{x}{2\sqrt{Dt}}\right)\right]$$

$N_{x_a}$=number of diffused aluminum atoms cm.$^{-3}$ at distance $x$ $N_{x_b}$=number of diffused boron atoms cm.$^{-3}$ at distance $x$ $N_B$=number of boron atoms cm.$^{-3}$ present in the high resistivity base material $N_{xt}$=total number of impurity atoms cm.$^{-3}$ at distance $x$ $N_o$=initial impurity concentration in low resistivity material This equation was solved with the following values to yield the information on the graph.

$N_{o_a}$=initial aluminum concentration, $7\times10^{18}$ atom cm.$^{-3}$ maximum solubility of aluminum in silicon at 1200° C.

$D_a$=diffusion constant of aluminum in silicon at 1200°, $1.3\times10^{-11}$ cm.$^2$ sec.$^{-1}$ $N_{o_b}$=initial boron concentration, $3\times10^{20}$ atoms cm.$^{-3}$ total atoms available in 0.0004 Ωcm. material $D_b$=diffusion constant of boron in silicon at 1200° C., $2.5\times10^{-12}$ cm.$^2$ sec.$^{-1}$ $t$=diffusion time, 20 hours.

The total impurity concentration in atoms is shown to range from $10^{20}$ at the alloy region to about $10^{15}$, which is the normal concentration of boron in the material, at a depth of about 50 microns. The graded base impurity concentration gradient follows the total concentration curve in changing from P+ near the aluminum silicon alloy region to a P-type conductivity beyond this depth.

Figure 7:
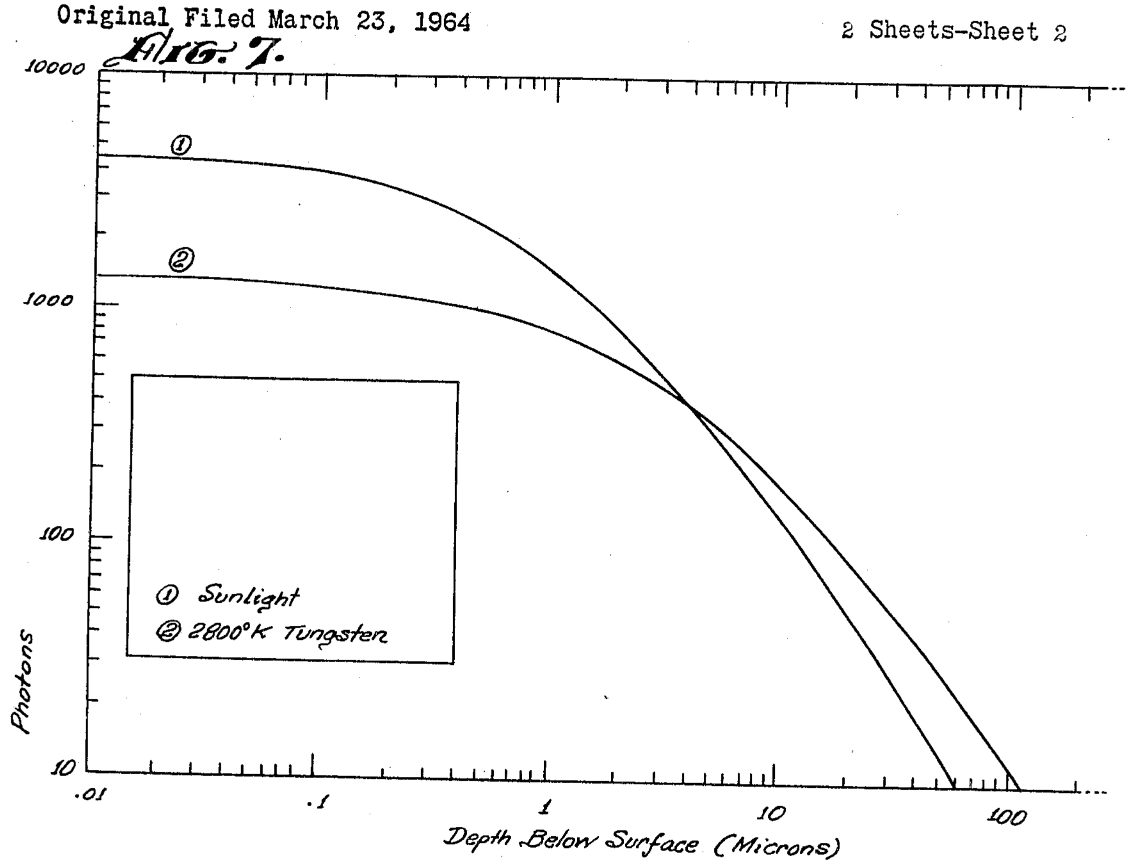
FIG. 7 is a graph showing photon absorbtion versus depth relationship in the present invention solar cell.

The aluminum silicon alloy region has no ill effects on the efficiency of the cell, although the high crystal distortion arising from crystal axis misorientation will cause it to have a high dislocation density if no effort is made to orient the high and low resistivity blanks prior to alloying. As shown in FIG. 7, nearly 100% of the photons impinging upon the surface of this cell will have been absorbed at 50 microns thickness when exposed to sunlight as shown by curve 1, and at slightly less when exposed to a 2800° K. tungsten source as shown by curve 2. If, on the other hand, the alloy region should impair the cell efficiency, two alternate courses are available. As just stated, a simple orienting of the crystal axis of the high and low resistivity material should minimize the crystal disorder in the alloyed region and thus reduce the recombination of generated carriers by some degree. Another method is to superimpose a temperature gradient across the low-high resistivity material sandwich with evaporated aluminum on the adjacent inner faces, as previously described. The higher temperature at the bottom causes the molten cell formed of aluminum-sicilon eutetic to move down quickly until it has reached the bottom of the sandwich, thus forming a single crystal structure containing a low resistivity portion followed by a high resistivity portion.

Figure 8:
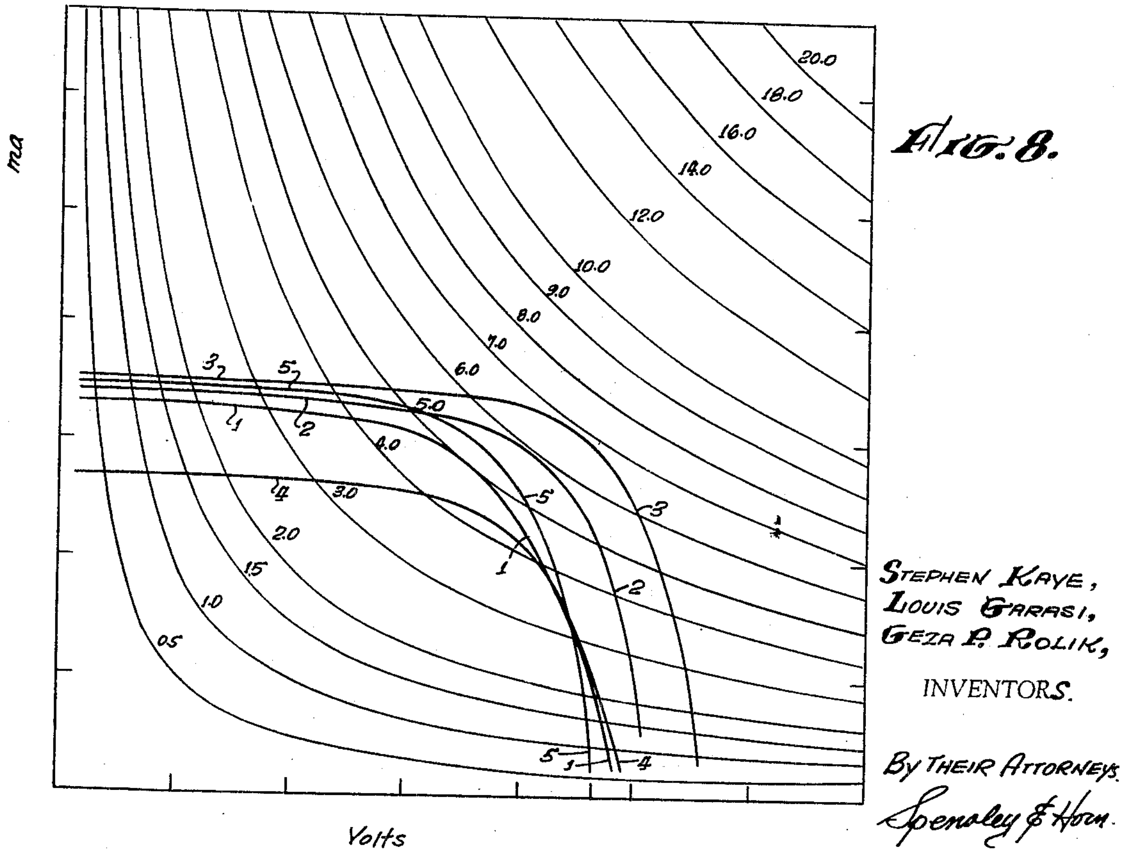
FIG. 8 is a graph showing typical electrical output characteristics of the cells constructed in accordance with this invention.

The electrical output of several of the cells made in accordance with the persent invention is shown in FIG. 8. Since 0.0004 ohms/cm. is the lowest resistivity limit practical with current crystal growing techniques, higher boron concentration and thus increased voltages can be achieved by either predepositing boron on one of the interfaces prior to the aluminum evaporation or by doping the aluminum with 0.5% to 1% boron during the evaporation. Subsequent use of a higher diffusion temperature, 1300° C., for example, would bring the initial boron concentration to a higher level.

An alternate method of forming opposite conductivity region on layer 26 is to epitaxially grow a N type layer on a P type substrate. This may be done by a hydrogen reduction of silicon tetrachloride in a RF heated quartz reactor. In one example, the substrate material had a resistivity of 0.003 ohms/cm. if a P-type silicon and the resistivity of the deposited film was approximately 1 ohm/cm. There was no appreciable diffusion of impurities from the low resistivity substrate to the epitaxially grown layer. By optimizing the resistivity and the thickness of the grown layer, the efficiency of the cells may be increased.

In FIG. 5 there is shown adjoining 1 x 2 cm. silicon bodies 40 and 41 which may alternatively be employed in place of bodies 10 and 12 as shown and described in connection with FIGS. 1–4. Body 41 will, in all respects, be the same as body 12 includes an aluminum layer 42. Body 40 on the other hand, however, will be differently produced. Instead of being of a consistent impurity concentration through its thickness dimension it will, instead, have a graded impurity concentration which may be produced by diffusion prior to its use in the present invention solar cell. Any P-type impurity may be used but boron has been found to be preferable. The impurity concentration should vary at the lowest surface 45 from approximately $10^{21}$ atoms per cubic cm. to $10^{14}$ to $10^{15}$ atoms per cubic cm. at the upper surface 46. From this point forward the solar cell is constructed exactly in the same manner as that described hereinabove in connection with the preferred embodiment.

As opposed to the various epitaxial methods of making graded resistivity layers, where only a limited amount of cell materials can be introduced into the reaction chamber at one time, relatively large quantities can be processed through the aluminum evaporation and diffusion steps in the aluminum alloy diffused method of fabricating graded base structures. Moreover, this method lends itself to more rigid control techniques, thus resulting in higher yields of higher efficiency solar cells.

The hereinabove described radiation resistant solar cell results in a graded resistivity base region disposed on a substantially thicker substrate which is of higher conductivity (of lower resistivity) than is the graded base region. The low resistivity substrate need not necessarily be single crystal material. It may vary from a thickness of 15 to 25 mils. It is alloyed to the high resistivity slice using as an alloying material an intermediate layer, preferably of aluminum which is typically one micron thick.

The high resistivity or graded base portion of the cell may vary in thickness from 5 to 10 mils.

The low resistivity layer or substrate gives sufficient thickness to the device for adequate mechanical strength as well as providing low contact resistance to the device. The high resistivity layer which is the thinner graded base region contains the junction and the aiding field. The advantages obtained by this construction include lower cost, greater mechanical strength and ease of manufacture.

There has thus been described a new and improved radiation resistant solar cell. While the invention has been described with reference to particular materials, others may be used as desired. Gallium and indium or thalium may be used in place of aluminum when P-type semiconductor materials are used. While the heretofore described illustrations have used a P-type starting material, an N type may be used with antimony-lead evaporated thereon. All III–V compounds where the lifetime is greater than 2 microseconds may be used. Further, the shape of the cell need not necessarily be rectangular nor need it be of any specific size.

We claim:

1. The method of constructing a radiation resistant solar cell including the steps of:
   (a) providing a low resistivity substrate region of a predetermined thickness of a predetermined conductivity type and active impurity concentration;
   (b) alloying a graded base region to said substrate region by the use of a material selected from the group consisting of aluminum, gallium, thallium and indium, the surface of said base region contiguous with said substrate region being of lower resistivity than the opposite surface thereof, said base region being substantially thinner than said substrate region and being of the same conductivity type;
   (c) providing on the base region opposite said substrate region a thin region of the opposite conductivity type.

2. The method defined in claim 1 wherein said thin region of opposite conductivity is provided by diffusion of an active impurity into said base region.

3. The method defined in claim 1, wherein said graded base region is formed by diffusion of an active impurity therein prior to alloying of said base region to said substrate region.

References Cited

UNITED STATES PATENTS

| | | | |
|---|---|---|---|
| 2,981,874 | 4/1961 | Rutz | 317—235 |
| 3,081,370 | 3/1963 | Miller | 136—89 |

L. DEWAYNE RUTLEDGE, Primary Examiner

R. A. LESTER, Assistant Examiner

U.S. Cl. X.R.

148—177, 185